（12）United States Patent
Lee et al.

(10) Patent No.: US 11,830,803 B2
(45) Date of Patent: Nov. 28, 2023

(54) CHIP-ON-FILM PACKAGE HAVING REDISTRIBUTION PATTERN BETWEEN SEMICONDUCTOR CHIP AND CONNECTION TERMINAL

(71) Applicant: Samsung Electronics Co., Ltd., Suwon-si (KR)

(72) Inventors: Kwanjai Lee, Yongin-si (KR); Jae-Min Jung, Seoul (KR); Jeong-Kyu Ha, Hwaseong-si (KR); Sang-Uk Han, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/699,525

(22) Filed: Mar. 21, 2022

(65) Prior Publication Data

US 2023/0037785 A1 Feb. 9, 2023

(30) Foreign Application Priority Data

Aug. 4, 2021 (KR) .......................... 10-2021-0102457

(51) Int. Cl.
*H01L 23/498* (2006.01)
*H01L 23/00* (2006.01)

(52) U.S. Cl.
CPC .... *H01L 23/4985* (2013.01); *H01L 23/49838* (2013.01); *H01L 23/49894* (2013.01); *H01L 24/73* (2013.01); *H01L 2224/73204* (2013.01)

(58) Field of Classification Search
CPC ........... H01L 23/4985; H01L 23/49838; H01L 23/49894; H01L 24/73
See application file for complete search history.

(56) References Cited

U.S. PATENT DOCUMENTS

| | | | |
|---|---|---|---|
| 7,732,933 B2 | 6/2010 | Chung et al. | |
| 7,763,986 B2 | 7/2010 | Kim | |
| 7,880,286 B2 | 2/2011 | Lee et al. | |
| 7,982,727 B2 | 7/2011 | Lee et al. | |
| 10,304,867 B2 | 5/2019 | Yoshioka et al. | |
| 10,553,529 B2 | 2/2020 | Im | |
| 2011/0233755 A1* | 9/2011 | Kim | H01L 25/0657 257/693 |
| 2012/0138968 A1 | 6/2012 | Shin et al. | |
| 2019/0189551 A1* | 6/2019 | Ha | H01L 21/4857 |
| 2020/0235463 A1 | 7/2020 | Cha et al. | |
| 2022/0068870 A1* | 3/2022 | Pak | H01L 23/3128 |

* cited by examiner

*Primary Examiner* — Michael Jung
(74) *Attorney, Agent, or Firm* — HARNESS, DICKEY & PIERCE, P.L.C.

(57) ABSTRACT

A chip-on-film package may include a film substrate including a chip region and an edge region, a semiconductor chip provided on the chip region and mounted on a top surface of the film substrate, the semiconductor chip including a chip pad adjacent to a bottom surface thereof, an input line and an output line provided on the edge region and disposed on the top surface of the film substrate, a connection terminal interposed between the film substrate and the semiconductor chip, and a redistribution pattern disposed between the semiconductor chip and the connection terminal.

19 Claims, 17 Drawing Sheets

CHIP-ON-FILM PACKAGE HAVING REDISTRIBUTION PATTERN BETWEEN SEMICONDUCTOR CHIP AND CONNECTION TERMINAL

CROSS-REFERENCE TO RELATED APPLICATIONS

This U.S. non-provisional patent application claims priority under 35 U.S.C. § 119 to Korean Patent Application No. 10-2021-0102457, filed on Aug. 4, 2021, in the Korean Intellectual Property Office, the entire contents of which are hereby incorporated by reference.

BACKGROUND OF THE INVENTION

The present disclosure relates to a semiconductor package, and in particular, to a chip-on-film package.

To meet the technical demands for small-sized, thin, durable, and/or lightweight electronic products, there has been proposed a chip-on-film (COF) packaging technology using a flexible film substrate. In the COF packaging technology, a semiconductor chip is directly mounted on a film substrate in a flip-chip bonding manner and is coupled to an external circuit through short lead wires. This COF package is applied to a panel of an electronic device such as a portable device (e.g., a cellular phone and PDA), a laptop computer, a display device, and/or the like.

SUMMARY

Some example embodiments of the inventive concepts provide a chip-on-film package, which can be designed with an increased degree of freedom and has an increased integration density.

Some example embodiments of the inventive concepts provide a chip-on-film package with improved electric and reliability characteristics.

According to an embodiment of the inventive concepts, a chip-on-film package may include a film substrate including a chip region and an edge region; a semiconductor chip on a top surface of the chip region of the film substrate; lead lines, including an input line and an output line, on a top surface of the edge region of the film substrate; a connection terminal between the film substrate and the chip pad; and a redistribution pattern between the semiconductor chip and the connection terminal.

According to an embodiment of the inventive concepts, a chip-on-film package may include a film substrate, a semiconductor chip on a top surface of the film substrate, the semiconductor chip including chip pads; lead lines on the top surface of the film substrate and electrically connected to the semiconductor chip; redistribution patterns between the chip pads of the semiconductor chip and the film substrate, the redistribution patterns including a first redistribution pattern and a second redistribution pattern; a first connection terminal between one of the lead lines and the first redistribution pattern; and a second connection terminal between another one of the lead lines and the second redistribution pattern. Side surfaces of the first redistribution pattern may be coplanar with corresponding side surfaces of the first connection terminal.

According to an embodiment of the inventive concepts, a chip-on-film package may include a film substrate; a semiconductor chip on a top surface of the film substrate, the semiconductor chip including a chip; lead lines, including an input line and an output line, on the top surface of the film substrate and electrically connected to the semiconductor chip, the input line extending in an opposite direction to the output lines; a connection terminal between the film substrate and the semiconductor chip; a redistribution pattern between a bottom surface of the chip pad and the connection terminal, a protection layer covering at least a portion of at least one of the input or the output lines; and an under-fill layer on the top surface of the film substrate, the under-fill layer filling a gap region between the film substrate and the semiconductor chip.

DETAILED DESCRIPTION

Example embodiments of the inventive concepts will now be described more fully with reference to the accompanying drawings, in which example embodiments are shown.

Figure 1:
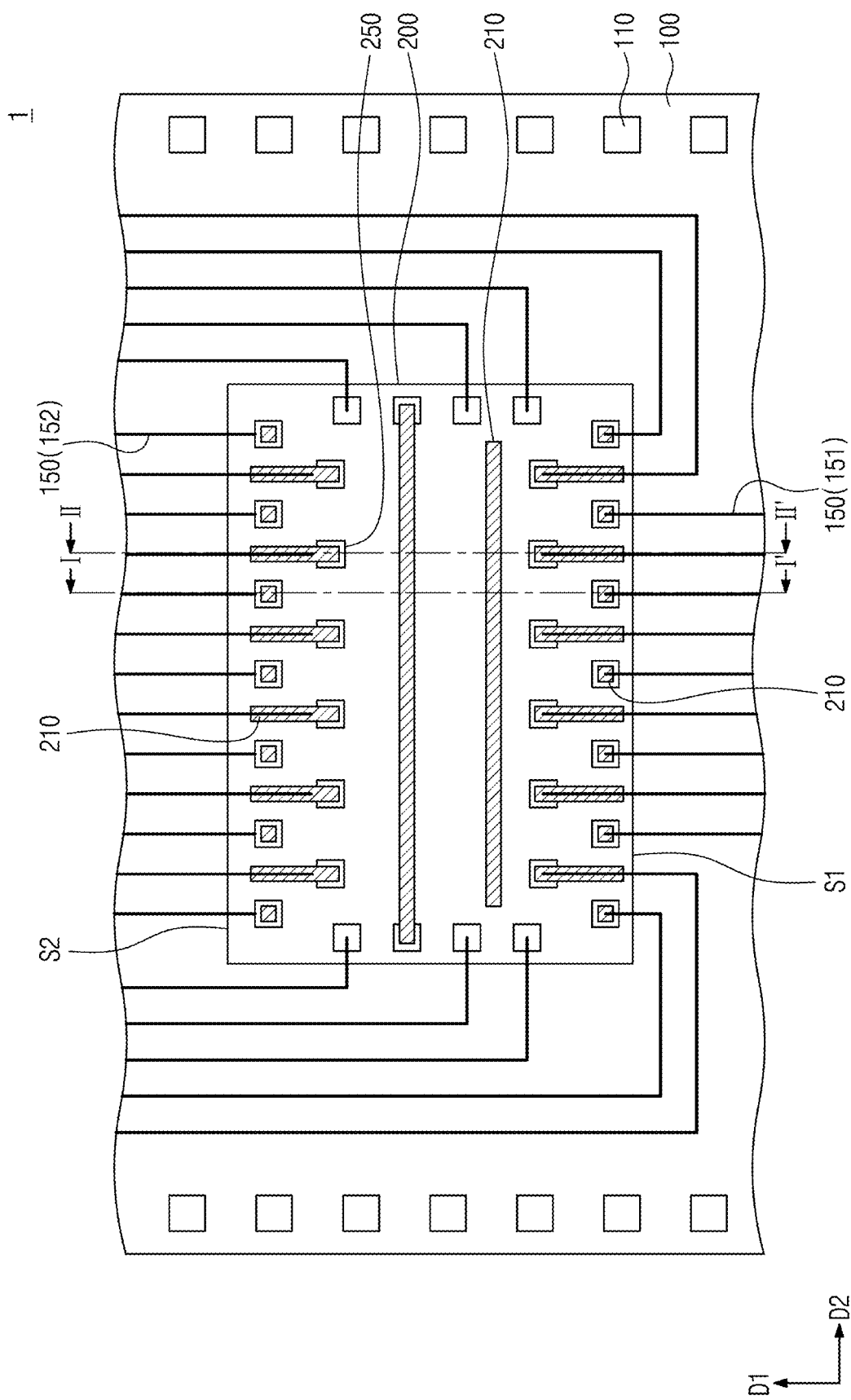
FIG. 1 is a plan view illustrating a chip-on-film package according to some example embodiments.
Figure 2:
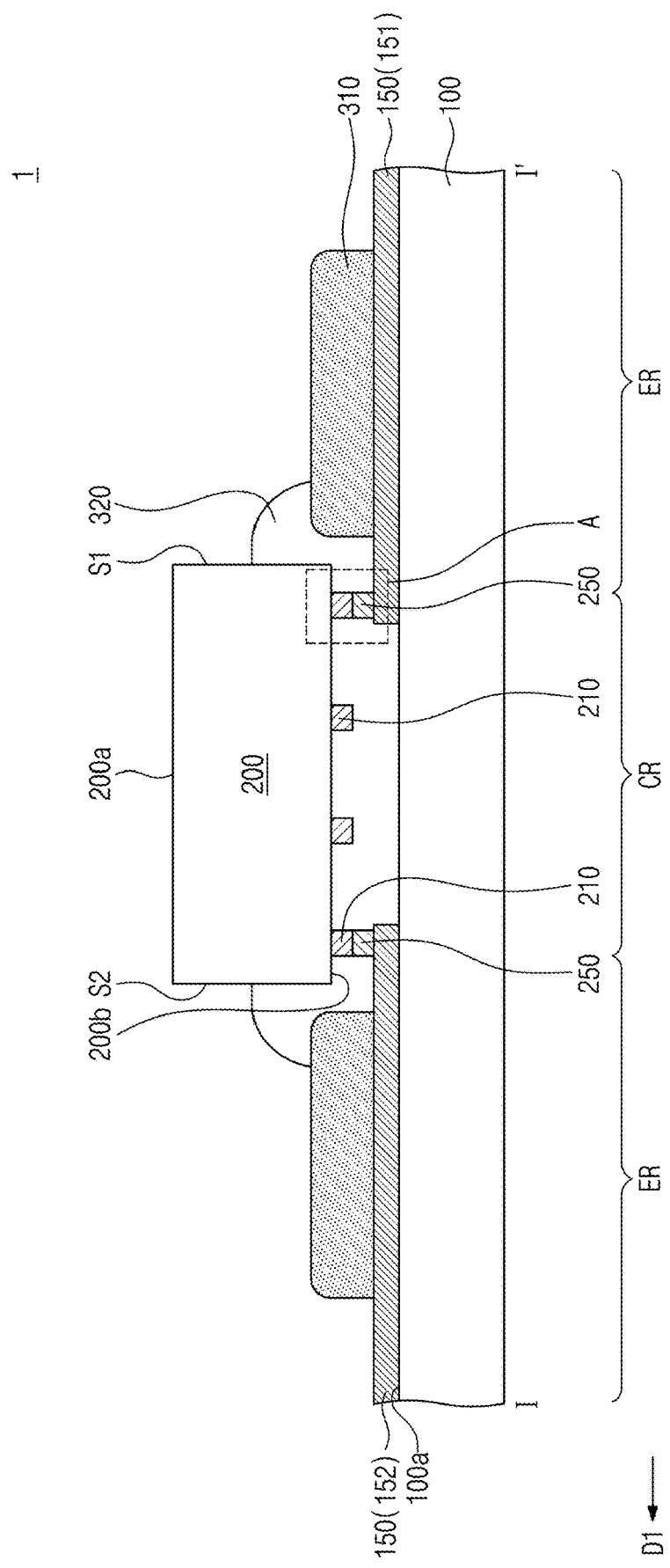
FIG. 2 is a sectional view, which is taken along a line I-I' of FIG. 1 to illustrate a chip-on-film package according to some example embodiments.
Figure 3:
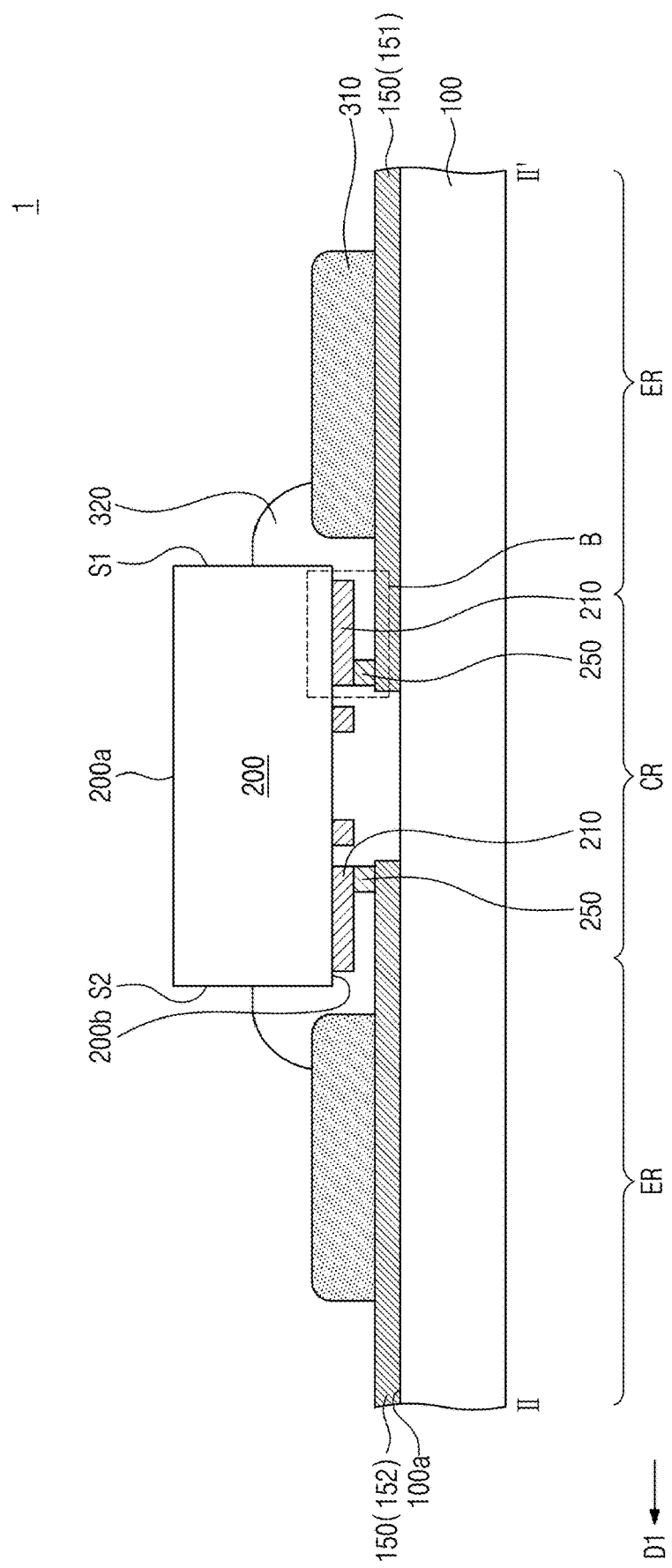
FIG. 3 is a sectional view, which is taken along a line II-II' of FIG. 1 to illustrate a chip-on-film package according to some example embodiments.
Figure 4:
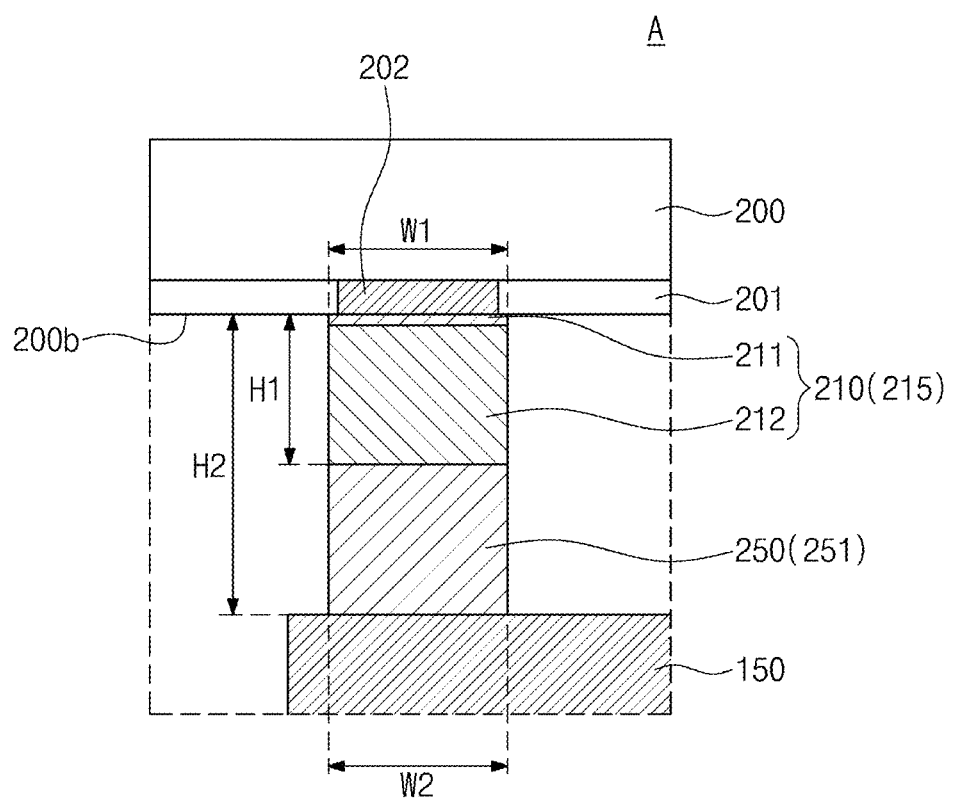
FIG. 4 is an enlarged sectional view of a portion 'A' of FIG. 2.
Figure 5:
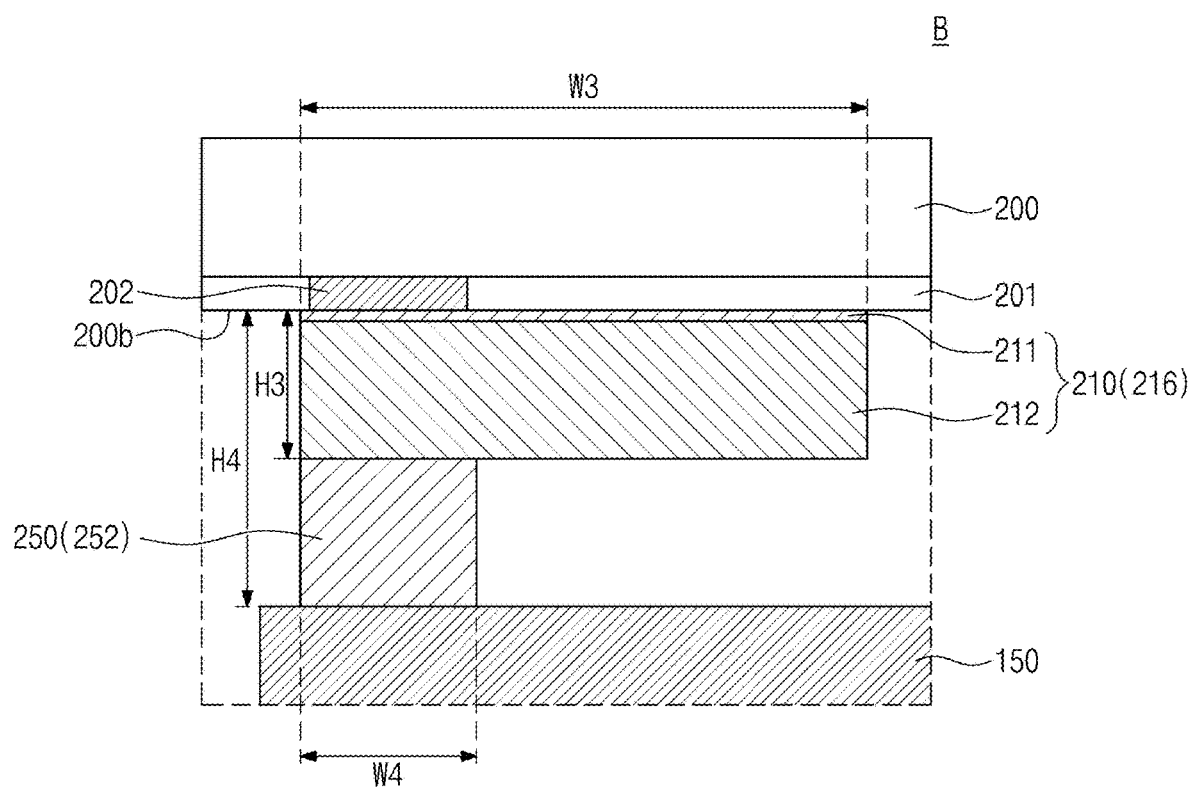
FIG. 5 is an enlarged sectional view of a portion 'B' of FIG. 3.

FIG. 1 is a plan view illustrating a chip-on-film package according to some example embodiments. FIG. 2 is a sectional view, which is taken along a line I-I' of FIG. 1 to illustrate a chip-on-film package according to some example embodiments. FIG. 3 is a sectional view, which is taken along a line II-II' of FIG. 1 to illustrate a chip-on-film package according to some example embodiments. FIG. 4 is an enlarged sectional view of a portion 'A' of FIG. 2. FIG. 5 is an enlarged sectional view of a portion 'B' of FIG. 3.

Referring to FIGS. 1 to 5, a chip-on-film package 1 may include a film substrate 100, a semiconductor chip 200, a redistribution pattern 210, a lead line 150, and a connection terminal 250.

The film substrate 100 may be a flexible board having a flexible property. The film substrate 100 may be, for example, formed of and/or include at least one of polymeric materials (e.g., a polyimide). The film substrate 100 may be provided to have a bendable property. The film substrate 100 may include a chip region CR and an edge region ER. For example, the chip region CR may be a region on which the semiconductor chip 200 is mounted, and the edge region ER may be a region which is provided to enclose the chip region CR.

When viewed in a plan view, sprocket holes 110 may be disposed near an edge of the film substrate 100. The sprocket holes 110 may be arranged in a first direction D1. The first direction D1 may be a direction parallel to a top surface 100a of the film substrate 100. The sprocket holes 110 may be provided to penetrate the film substrate 100. The sprocket holes 110 may be used to wind and/or unwind the chip-on-film package 1.

The semiconductor chip 200 may be provided on the chip region CR of the film substrate 100. The semiconductor chip 200 may be mounted on the top surface 100a of the film substrate 100. The semiconductor chip 200 may have a top surface 200a and a bottom surface 200b, which are opposite to each other. The top surface 200a and the bottom surface 200b may be, respectively, referred to as an inactive surface and an active surface. The semiconductor chip 200 may have a first side surface S1 and a second side surface S2, which are extended parallel to a second direction D2. The second direction D2 may be parallel to the top surface 100a of the film substrate 100 but may not be parallel to the first direction D1. For example, the second direction D2 may be a direction parallel to the top surface 100a and perpendicular to the first direction D1. The semiconductor chip 200 may include chip pads 202, which are provided near, in, and/or at the bottom surface 200b of the semiconductor chip 200. The semiconductor chip 200 may include a passivation layer 201, which is provided near and/or on the bottom surface 200b of the semiconductor chip 200 to expose the chip pads 202. The passivation layer 201 may be formed of and/or include at least one insulating material. For example, the passivation layer 201 may be formed of and/or include at least one of silicon oxide and/or silicon nitride.

In some example embodiments, the semiconductor chip 200 may be (and/or include) at least one of a logic chop, a buffer chip, a driver chip, and/or a memory chip. For example, the semiconductor chip 200 may be (and/or include) a display driver chip, which is used to drive a display panel. For example, the semiconductor chip 200 may be configured to generate image signals using data signals transmitted from a timing controller and to output the image signals to the display panel. In some example embodiments, the semiconductor chip 200 may be (and/or include) a timing controller connected to a display driver chip. The chip-on-film package 1 may also be used for (and/or in_an electronic device excluding a display device. For example, the semiconductor chip 200 may be a semiconductor chip, which is configured to drive the electronic device.

The lead lines 150 may be provided on the edge region ER of the film substrate 100, and may partially extend into the chip region CR of the film substrate 100. The lead lines 150 may be disposed on the top surface 100a of the film substrate 100. The lead lines 150 may include input lines 151 and output lines 152. The input lines 151 may be spaced apart from the output lines 152 and may be electrically and/or physically disconnected from the output lines 152. The input lines 151 may be extended in an opposite direction of the output lines 152. As an example, ends of the input lines 151 may be electrically connected to the semiconductor chip 200, and opposite ends of the input lines 151 may be extended in an opposite direction of the first direction D1. Ends of the output lines 152 may be electrically connected to the semiconductor chip 200, and opposite ends of the output lines 152 may be extended in the first direction D1. The input (and output) lines 151 (and 152) may be extended to (or from) a region on the chip region CR and may be electrically connected to the semiconductor chip 200. In some example embodiments, the input lines 151 may be electrically connected to a circuit substrate, and the output lines 152 may be electrically connected to, e.g., a display device. In some example embodiments, the circuit substrate may be a printed circuit board (PCB) and/or a flexible printed circuit board (FPCB). In some example embodiments, the display device may be a display panel. The input lines 151 may be used to transmit signal voltages (and/or the like), which are transmitted from the circuit substrate, to the semiconductor chip 200, and the output lines 152 may be used to transmit image signals or the like, which are generated in the semiconductor chip 200, to the display device. In the present specification, the expression "two elements are electrically connected/coupled to each other" may mean that the elements are directly connected/coupled to each other and/or are indirectly connected/coupled to each other through another conductive element. The lead lines 150 (e.g., input/output lines 151 and 152) may be formed of and/or include a conductive material, such as a conductive metal (e.g., copper, aluminum, and/or the like) and/or a conductive polymer. In some example embodiments, at least one of the input/output lines 151 and 152 may not be extended to a space on a center region of the chip region CR. The lead lines 150 and driving integrated circuits in the semiconductor chip 200 may be electrically connected to each other through the redistribution pattern 210.

In some example embodiments, the lead lines 150 may be disposed not only on the top surface 100a of the film substrate 100 but also on a bottom surface of the film substrate 100, unlike the illustrated structure. In this case, the chip-on-film package 1 may further include a conductive via (not shown), which is provided to penetrate the film substrate 100.

The connection terminals 250 may be interposed between the film substrate 100 and the semiconductor chip 200. Each of the connection terminals 250 may be electrically connected to a corresponding one of the input/output lines 151 and 152. The semiconductor chip 200 may be electrically connected to the input/output lines 151 and 152 through the connection terminals 250. The connection terminals 250 may be formed of (and/or include) a conductive material such as a conductive metal (e.g., at least one of gold, nickel, tin, copper, and/or the like). The connection terminals 250 may include, e.g., at least one of solder pillars and/or solder bumps. When viewed in a plan view, the connection terminals 250, which are adjacent to the first and second side surfaces S1 and S2 of the semiconductor chip 200, may be arranged in, e.g., a zigzag shape.

The redistribution pattern 210 may be disposed on the bottom surface 200b of the semiconductor chip 200. The redistribution pattern 210 may be interposed between the semiconductor chip 200 and the connection terminals 250. The redistribution pattern 210 may be vertically spaced apart from at least one of the input and output lines 151 and 152. For example, the redistribution pattern 210 and the at least one of the input and output lines 151 and 152 may be located at different levels from each other. The redistribution pattern 210 and the connection terminals 250 may also be located at different levels from each other. In the present specification, the level may mean a vertical height measured from, e.g., the top surface 100a of the substrate 100. In some example embodiments, a top surface of the redistribution pattern 210 may be coplanar with bottom surfaces of the chip pads 202. The top surface of the redistribution pattern 210 may be in direct contact with the bottom surface of the chip pad 202. The redistribution pattern 210 may be electrically connected to the chip pad 202. The semiconductor chip 200 and the connection terminal 250 may be electrically connected to each other through the redistribution pattern 210, and thus, the semiconductor chip 200 may be electrically connected to the lead lines 150. Some of the connection terminals 250, which are disposed adjacent to the center of the chip region CR, may be electrically connected to the lead lines 150 through the redistribution patterns 210, and since the connection terminals 250 are arranged in a zigzag shape, a pitch of the connection terminals 250 may be reduced.

The redistribution pattern 210 may be spaced apart from the input/output lines 151 and 152 and may not be in direct contact with the lead lines 150. For example, when viewed in a plan view, a total area of the redistribution patterns may be equal to or smaller than 80% of an area of the semiconductor chip 200. The redistribution pattern 210 may be formed of (and/or include) a conductive material such as a conductive metal (e.g., copper, aluminum, and/or the like). For example, in some example embodiments, the redistribution pattern 210 may be formed of (and/or include) the same material as the lead line 150. In some example embodiments, a metal layer may be further provided to cover the redistribution pattern 210. The metal layer may protect the redistribution pattern 210 from the outside. The metal layer may be formed of (and/or include) at least one metallic material (e.g., gold and tin).

As shown in FIGS. 4 and 5, the redistribution pattern 210 may include a seed pattern 211 and a conductive pattern 212. The seed pattern 211 may be interposed between the conductive pattern 212 and the semiconductor chip 200. The seed pattern 211 may be in contact with the bottom surface 200b of the semiconductor chip 200. The conductive pattern 212 may be spaced apart from the semiconductor chip 200 with the seed pattern 211 interposed therebetween. The seed pattern 211 may be formed of (and/or include) at least one conductive metal (e.g., titanium, tungsten, copper, and/or the like). The conductive pattern 212 may be formed of (and/or include) a conductive material such as a metal (e.g., copper, aluminum, and/or the like).

As shown in FIGS. 4 and 5, the redistribution pattern 210 may include a first redistribution pattern 215 and a second redistribution pattern 216. The connection terminals 250 may include a first connection terminal 251 and a second connection terminal 252. The first connection terminal 251 may be interposed between the film substrate 100 and the first redistribution pattern 215. The second connection terminal 252 may be interposed between the film substrate 100 and the second redistribution pattern 216.

The first redistribution pattern 215 may be vertically overlapped with the first connection terminal 251. The first redistribution pattern 215 may cover a top surface of the first connection terminal 251. A width W1 of the first redistribution pattern 215 may be substantially equal to a width W2 of the first connection terminal 251. In the present specification, the width may mean a length that is measured in a direction parallel to the top surface 100a of the film substrate 100 (e.g., in the first direction D1). When viewed in a plan view, an area of the first redistribution pattern 215 may be substantially equal to an area of the first connection terminal 251. For example, in some example embodiments, side surfaces of the first redistribution pattern 215 may be coplanar with corresponding side surfaces of the first connection terminal 251. A height H1 of the first redistribution pattern 215 may be 20% to 80% of a total height H2 of the first redistribution pattern 215 and the first connection terminal 251. In the present specification, the height may mean a length that is measured in a direction perpendicular to the top surface 100a of the film substrate 100.

A portion of the second redistribution pattern 216 may be vertically overlapped with the second connection terminal 252. The second redistribution pattern 216 may cover a top surface of the second connection terminal 252. A width W3 of the second redistribution pattern 216 may be larger than a width W4 of the second connection terminal 252. When viewed in a plan view, an area of the second redistribution pattern 216 may be larger than an area of the second connection terminal 252. The second connection terminal 252 may be provided to expose a portion of the second redistribution pattern 216. In some example embodiment, only some of the side surfaces of the second redistribution pattern 216 may be coplanar with corresponding side surfaces of the second connection terminal 252. A height H3 of the second redistribution pattern 216 may be 20% to 80% of a total height H4 of the second redistribution pattern 216 and the second connection terminal 252.

A protection layer 310 may be provided on the top surface 100a of the film substrate 100. The protection layer 310 may be disposed on the lead lines 150. The protection layer 310 may cover at least a portion of the lead lines 150. The protection layer 310 may be formed of (and/or include) at least one of an insulating material (e.g., solder resist materials). The protection layer 310 may be provided to protect the lead lines 150. For example, the protection layer 310 may prevent the lead lines 150 from being oxidized and/or forming a short circuit in a subsequent thermal treatment process.

An under-fill layer 320 may be provided on the top surface 100a of the film substrate 100. The under-fill layer 320 may fill a gap region between the film substrate 100 and the semiconductor chip 200. The under-fill layer 320 may cover a portion of at least one of the side surfaces of the semiconductor chip 200 and may cover a portion of the protection layer 310. The under-fill layer 320 may be provided to hermetically seal and/or encapsulate the redistribution patterns 210 and the connection terminals 250. The under-fill layer 320 may protect the redistribution patterns 210 and the connection terminals 250 from the outside and may prevent the connection terminals 250 from being in contact with each other. The under-fill layer 320 may be formed of (and/or include) an insulating material, such as insulating polymers (e.g., epoxy-based polymers).

In general, as the number of the lead lines is being increased to improve performance of the chip-on-film package, voids may be formed in the under-fill layer covering the lead lines. Furthermore, in a case wherein the lead lines are disposed in a center region of a chip region, in order to connect the lead lines to the chip pads, it may be necessary to exert a pressure on them. In this case, electric characteristics of transistors, which are provided adjacent to the chip pads in the semiconductor chip, may be deteriorated.

According to some example embodiments of the inventive concepts, the chip-on-film package 1 may include the redistribution pattern 210 provided on the bottom surface 200b of the semiconductor chip 200. Since the redistribution pattern 210 is provided, the lead lines 150 may not be extended to a space on the center region of the chip region CR. Accordingly, it may be possible to prevent the electric characteristics of the transistors, which are provided adjacent to the chip pads 202 on the center region of the chip region CR in the semiconductor chip 200, from being deteriorated. In addition, it may be possible to prevent a void from being formed between the lead line 150 and the under-fill layer 320 and thereby to improve reliability characteristics of the chip-on-film package. Furthermore, since the redistribution pattern 210 is provided, the connection terminals 250 may be arranged in a zigzag shape, and in this case, the connection terminals 250 may have a reduced pitch. Thus, it may be possible to reduce a size of the semiconductor chip and/or the chip-on-film package and to increases an integration density of the chip-on-film package.

Figure 6:
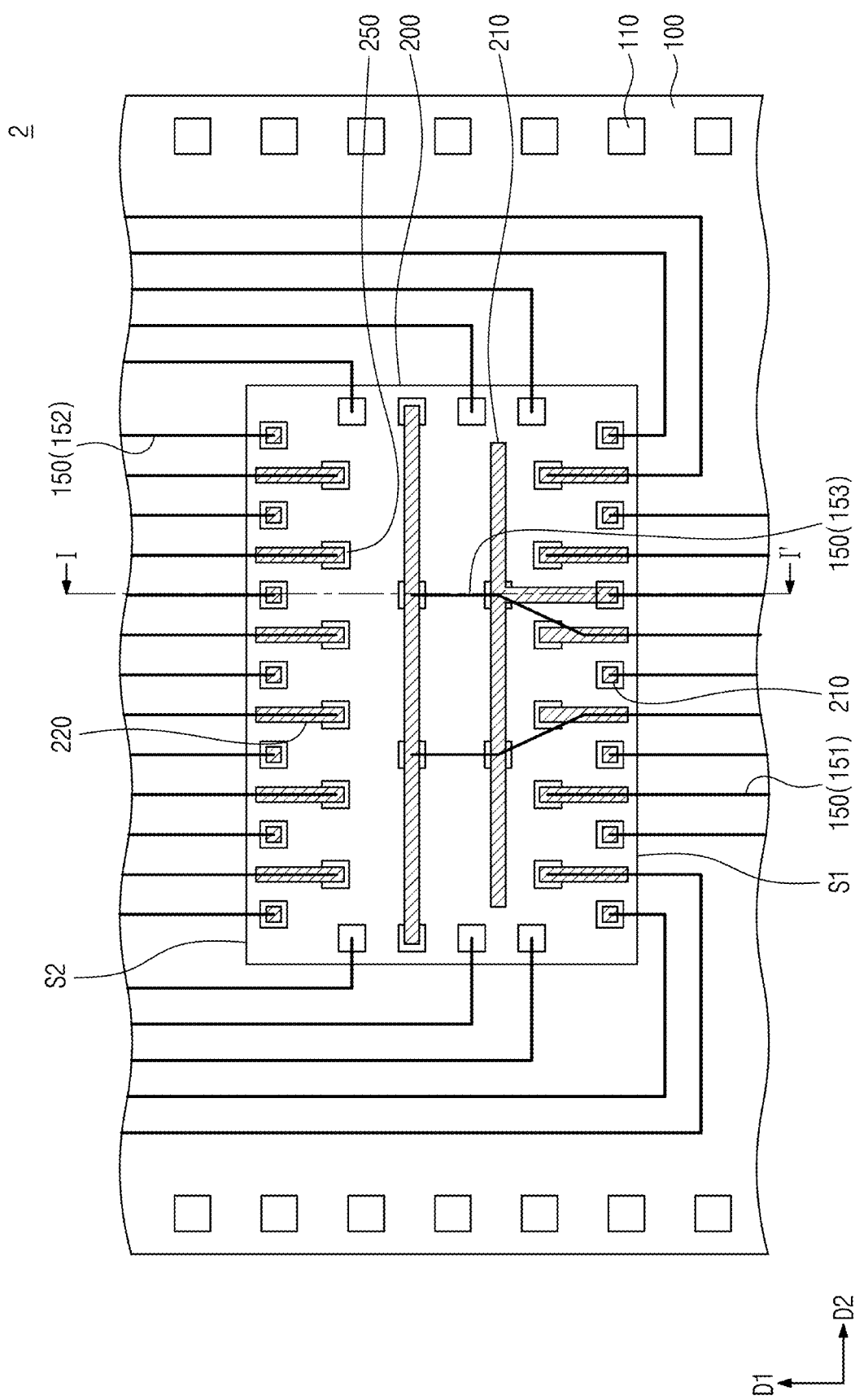
FIG. 6 is a plan view illustrating a chip-on-film package according to some example embodiments.
Figure 7:
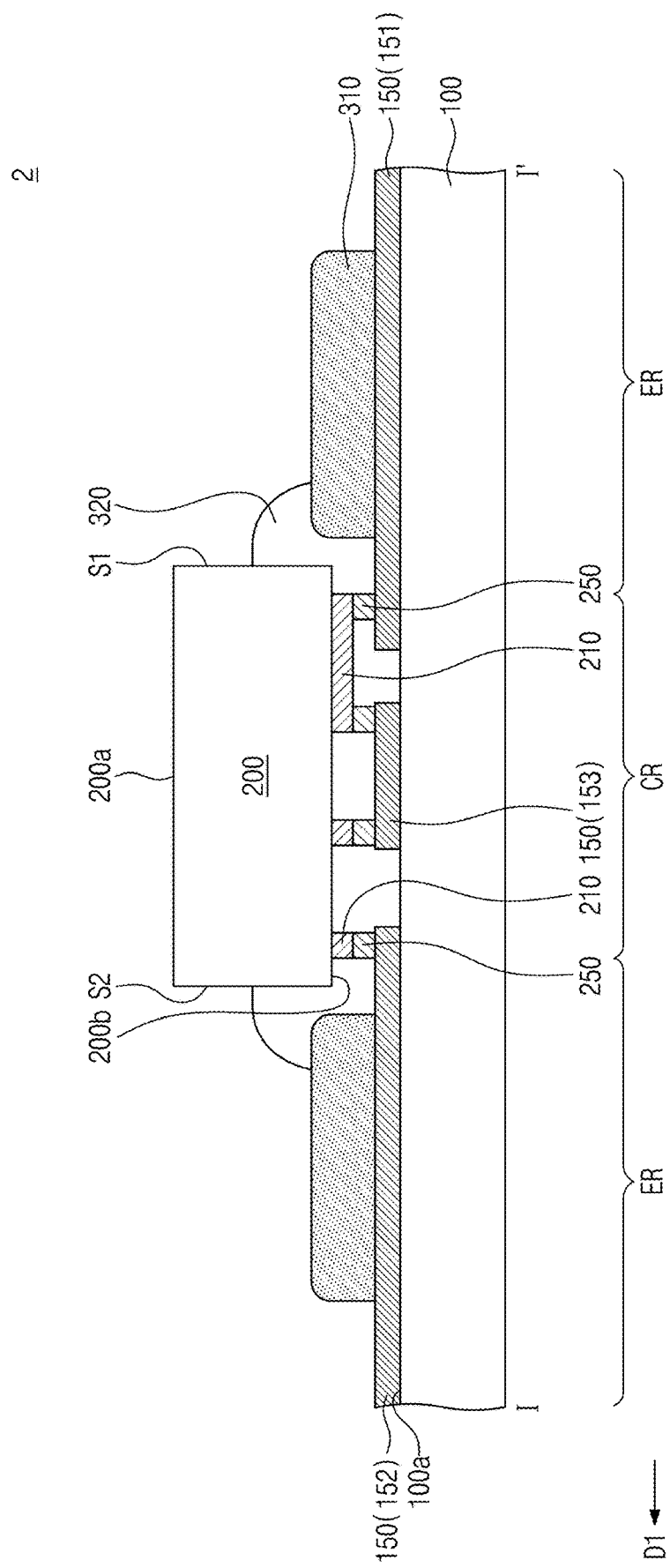
FIG. 7 is a sectional view, which is taken along a line I-I' of FIG. 6 to illustrate a chip-on-film package according to some example embodiments.

FIG. 6 is a plan view illustrating a chip-on-film package according to some example embodiments. FIG. 7 is a sectional view, which is taken along a line I-I' of FIG. 6 to illustrate a chip-on-film package according to some example embodiments. For the sake of brevity, the same element as in the chip-on-film package 1 previously described with reference to FIGS. 1 to 5 may be identified by the same reference number without repeating an overlapping description thereof.

Referring to FIGS. 6 and 7, a chip-on-film package 2 may include the film substrate 100, the semiconductor chip 200, the redistribution pattern 210, the lead line 150, and the connection terminal 250.

The lead line 150 may further include an additional input line 153, which is extended to the center region of the chip region CR, in addition to the input and output lines 151 and 152. The additional input line 153 may be extended into the chip region CR and may be connected to the redistribution pattern 210, which is disposed in an internal portion of the chip region CR. When viewed in a plan view, the additional input line 153 may be provided to cross the redistribution pattern 210. The additional input line 153 may be extended in the opposite direction of the first direction D1. The additional input line 153 may be, e.g., an interconnection line, which is used to deliver an electric power. For example, the additional input line 153 may be electrically connected to the semiconductor chip 200 through the connection terminal 250 and the redistribution pattern 210. The additional input line 153 may be formed of (and/or include) a conductive material, such as conductive metal (e.g., copper, aluminum, and/or the like).

According to some example embodiments, since the lead lines 150 and the redistribution patterns 210 are spaced apart from each other (and/or are not in contact with each other) it may be possible to increase a degree of freedom in designing the lead lines 150, the redistribution patterns 210, the connection terminals 250, and/or the chip pads 202.

Figure 8:
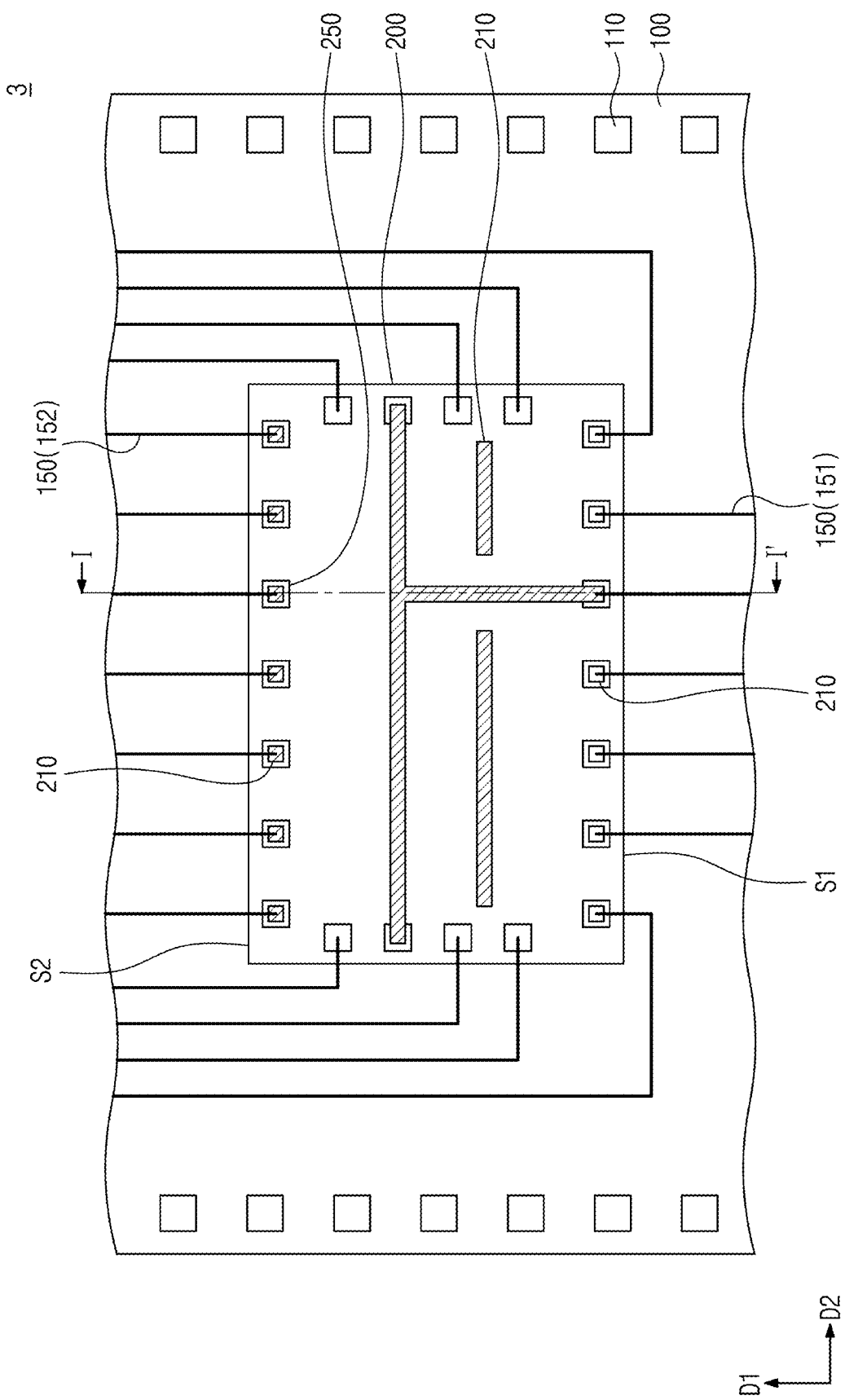
FIG. 8 is a plan view illustrating a chip-on-film package according to some example embodiments.
Figure 9:
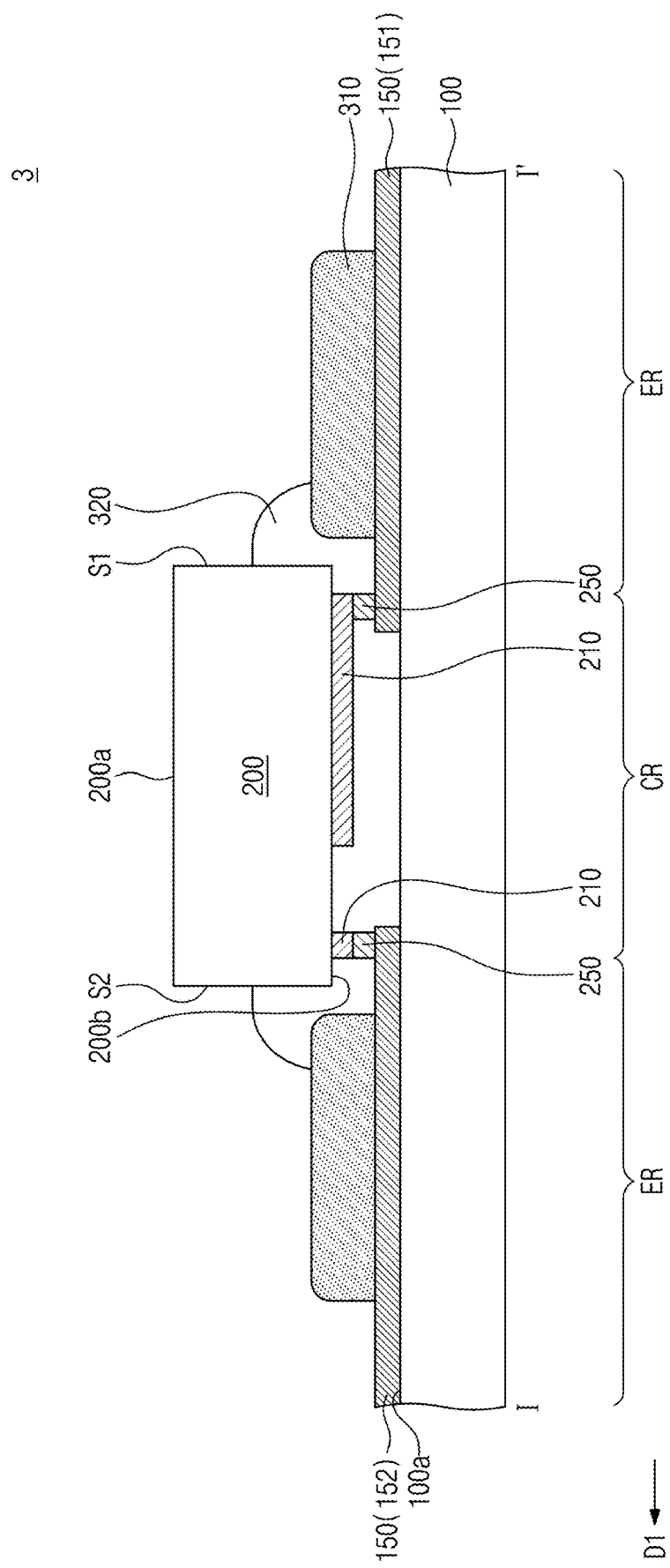
FIG. 9 is a sectional view, which is taken along a line I-I' of FIG. 8 to illustrate a chip-on-film package according to some example embodiments.

FIG. 8 is a plan view illustrating a chip-on-film package according to some example embodiments. FIG. 9 is a sectional view, which is taken along a line I-I' of FIG. 8 to illustrate a chip-on-film package according to some example embodiments. For the sake of brevity, the same element as in the chip-on-film package 1 previously described with reference to FIGS. 1 to 5 may be identified by the same reference number without repeating an overlapping description thereof.

Referring to FIGS. 8 and 9, the lead line 150 may not be extended to a space on the center region of the chip region CR of the film substrate 100. The lead lines 150 and driving integrated circuits in the semiconductor chip 200 may be electrically connected to each other through the redistribution pattern 210.

When viewed in a plan view, the connection terminals 250 may be arranged in an in-line shape. For example, the connection terminals 250, which are disposed adjacent to the first side surface S1 of the semiconductor chip 200, may be aligned to each other in the second direction D2, and the connection terminals 250, which are disposed adjacent to the second side surface S2 of the semiconductor chip 200, may be aligned to each other in the second direction D2. In some example embodiments, when viewed in a plan view, the connection terminals 250, which are disposed adjacent to the first side surface S1 of the semiconductor chip 200, may be spaced apart from the first side surface S1 of the semiconductor chip 200 by the same distance; and/or when viewed in a plan view, the connection terminals 250, which are disposed adjacent to the second side surface S2 of the semiconductor chip 200, may be spaced apart from the second side surface S2 of the semiconductor chip 200 by the same distance.

FIGS. 10, 12, 14, and 15 are sectional views, which are taken along the line I-I' of FIG. 1 to illustrate a method of fabricating a chip-on-film package according to some example embodiments. FIG. 11 is an enlarged sectional view of a portion 'A' of FIG. 10. FIGS. 13A, 13B, and 13C are enlarged sectional views of a portion 'A' of FIG. 12, which are provided to illustrate a method of fabricating a chip-on-film package according to some example embodiments. For the sake of brevity, the same element as in the chip-on-film package 1 previously described with reference to FIGS. 1 to 5 may be identified by the same reference number without repeating an overlapping description thereof.

Figure 10:
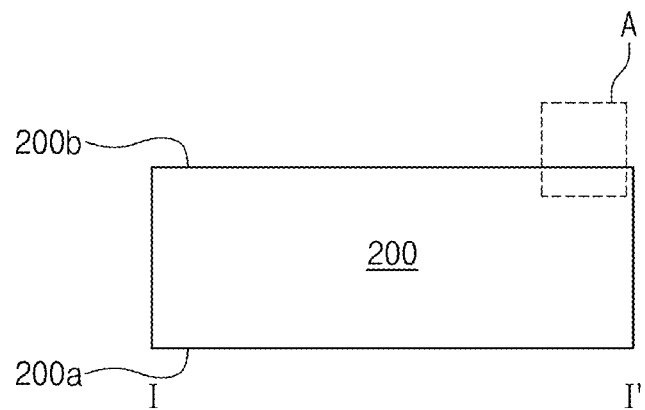
FIGS. 10, 12, 14, and 15 are sectional views, which are taken along the line I-I' of FIG. 1 to illustrate a method of fabricating a chip-on-film package according to some example embodiments.
Figure 11:
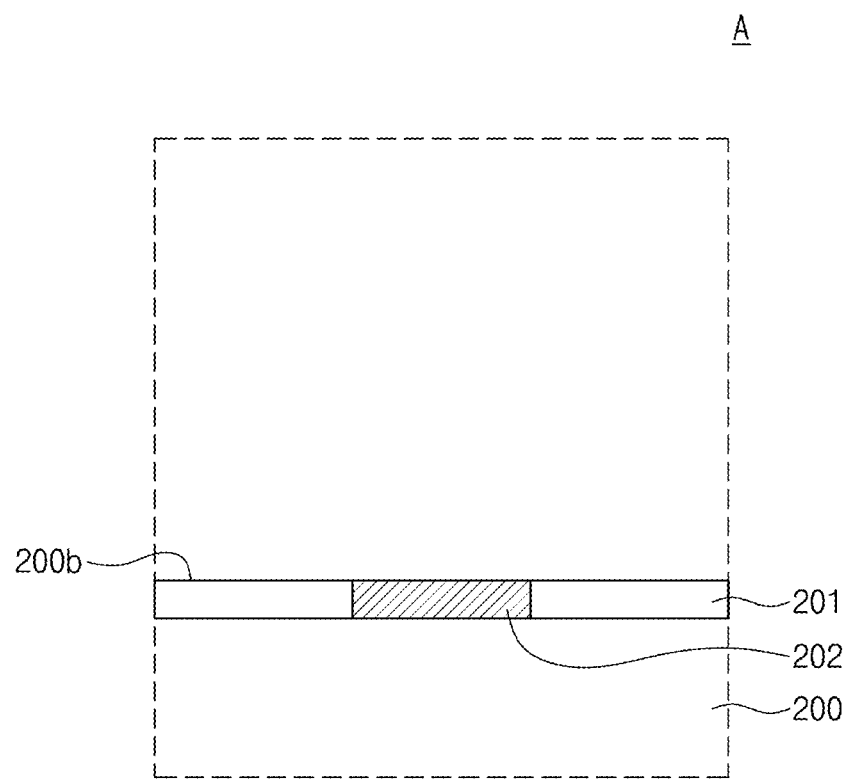
FIG. 11 is an enlarged sectional view of a portion 'A' of FIG. 10.

Referring to FIGS. 10 and 11, the semiconductor chip 200 may be provided. The semiconductor chip 200 may be prepared such that the top surface 200a of the semiconductor chip 200 is oriented in a downward direction. Meanwhile, for consistency in description, a top surface, a bottom surface, an upper portion, and a lower portion of each element will be defined, based on the structure shown in FIGS. 1 to 5. The semiconductor chip 200 may include the chip pads 202, which are disposed near (and/or at) the bottom surface 200b of the semiconductor chip 200. The semiconductor chip 200 may include the passivation layer 201, which is provided near (and/or at) the bottom surface 200b of the semiconductor chip 200 to expose the chip pads 202. The passivation layer 201 may be formed of (and/or include) an insulator. For example, the passivation layer 201 may be formed of (and/or include) at least one of silicon oxide and/or silicon nitride. The semiconductor chip 200 is illustrated to be a chip-level structure, but the example embodiments are not limited to this example. For example, the semiconductor chip 200 may be provided as a wafer-level structure.

Figure 12:
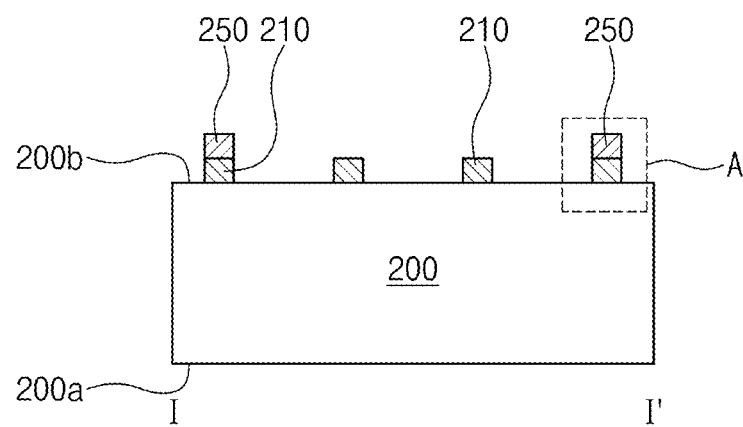
Figure 13A:
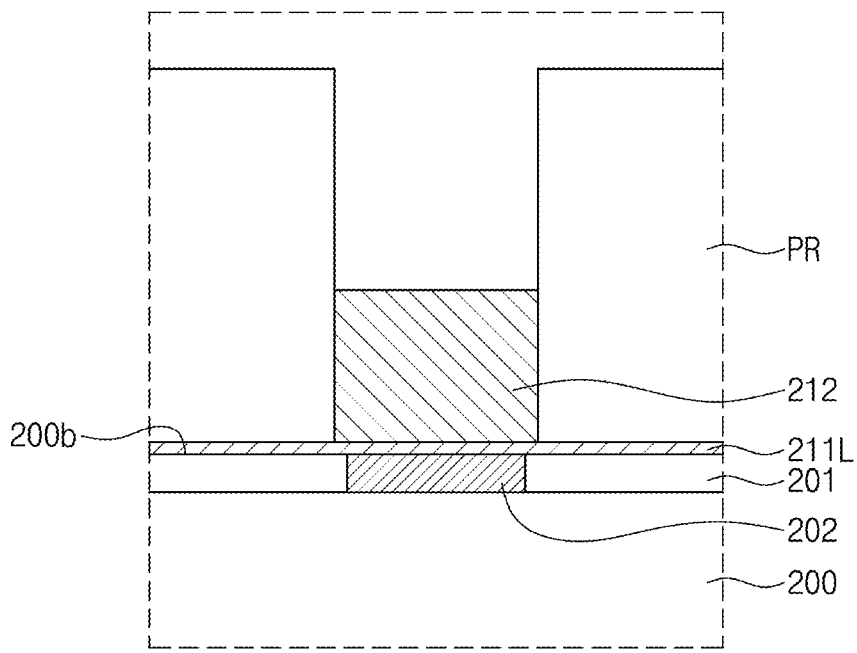
FIGS. 13A, 13B, and 13C are enlarged sectional views of a portion 'A' of FIG. 12, which are provided to illustrate a method of fabricating a chip-on-film package according to some example embodiments.
Figure 13B:
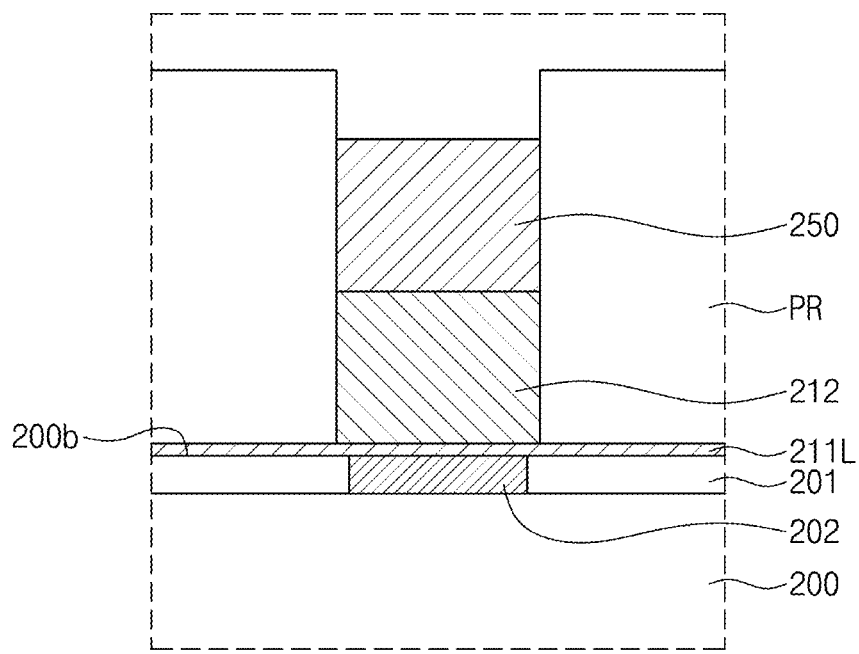
Figure 13C:
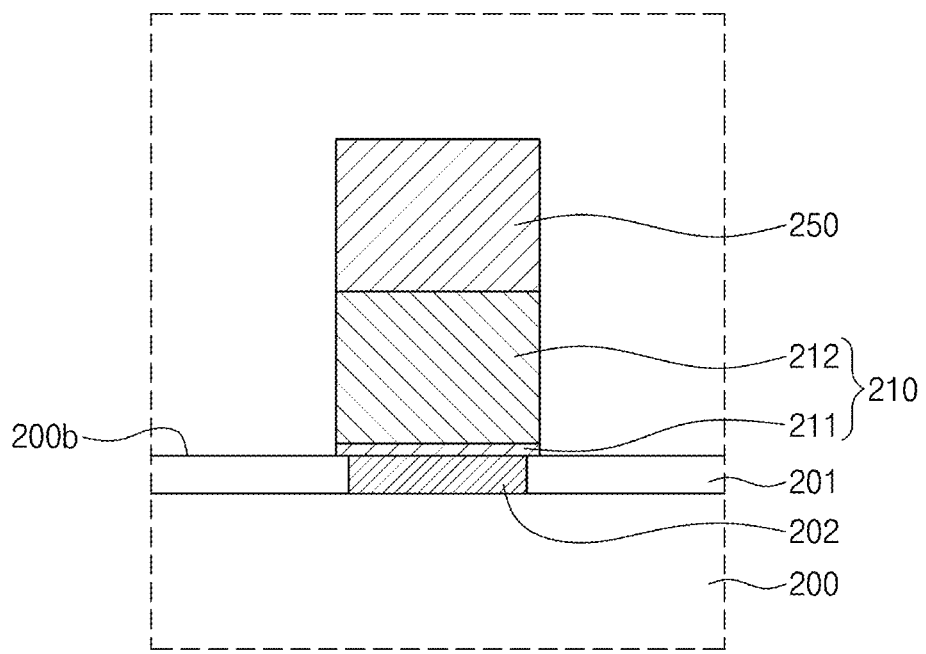

Referring to FIGS. 12 and 13A, a seed layer 211L may be formed on the bottom surface 200b of the semiconductor chip 200. The seed layer 211L may be formed to cover the bottom surface 200b of the semiconductor chip 200. For example, the seed layer 211L may be formed by a deposition method such as a physical vapor deposition (PVD) process, a chemical vapor deposition (CVD) process, an atomic layer deposition (ALD) process, a sputtering process, and/or the like. The seed layer 211L may be formed of (and/or include) a conductive material such as a conductive metal (e.g., titanium, tungsten, copper, and/or the like).

A photoresist pattern PR may be formed on the seed layer 211L. The photoresist pattern PR may define a region, in which the redistribution pattern 210 will be formed. The conductive pattern 212 may be formed on a portion of the seed layer 211L, which is exposed by the photoresist pattern PR. For example, the conductive pattern 212 may be formed by an electroplating process using the seed layer 211L as a plating electrode. The conductive pattern 212 may be formed of (and/or include) for example, a metal such as copper.

Referring to FIGS. 12 and 13B, the connection terminal 250 may be formed on the conductive pattern 212. The connection terminal 250 may be provided in the form of a solder pillar and a solder bump. The connection terminal 250 may be formed of (and/or include) at least a conductive material such as a conductive metal (e.g., gold, nickel, tin, copper, and/or the like). For example, in some example embodiments, the conductive material of the connection terminal 250 may be a eutectic alloy.

Referring to FIGS. 12 and 13C, the photoresist pattern PR may be removed to expose a portion of the seed layer 211L, side surfaces of the conductive pattern 212, and the connection terminal 250. For example, the photoresist pattern PR may be removed by a strip process.

During the removal of the photoresist pattern PR, the exposed portion of the seed layer 211L may also be removed to form the seed pattern 211. The seed pattern 211 may be formed between the conductive pattern 212 and the bottom surface 200b of the semiconductor chip 200. The seed pattern 211 may be formed to expose a portion of the passivation layer 201. For example, the formation of the seed pattern 211 may include an etching process.

Figure 14:
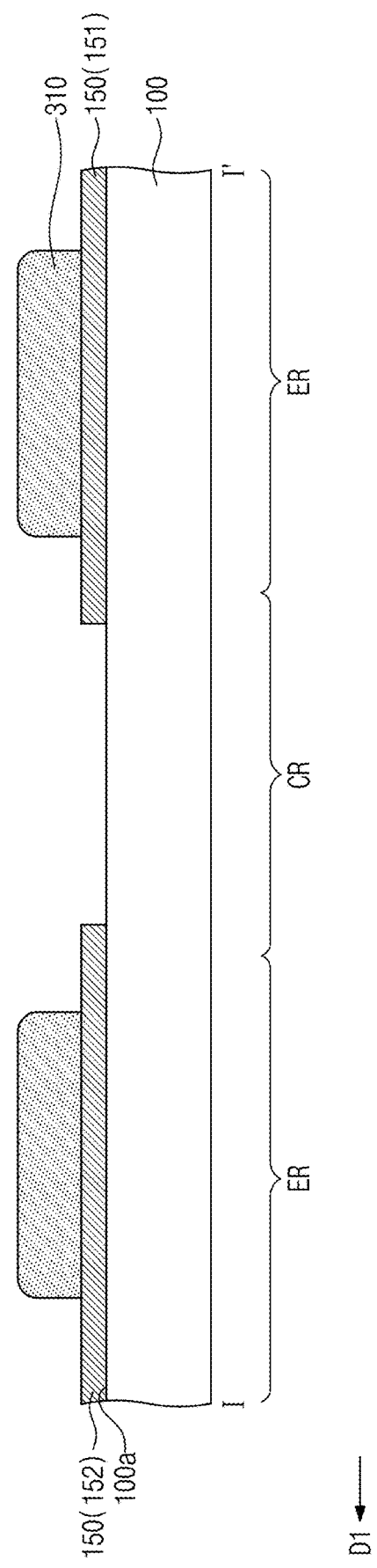

Referring to FIG. 14, the film substrate 100 may be provided. The film substrate 100 may be a flexible substrate and may include at least one of polymeric materials (e.g., a polyimide). The film substrate 100 may include the chip region CR and the edge region ER. In some example embodiments, the chip region CR may be a region, on which the semiconductor chip 200 is to be mounted, and the edge region ER may be a region, which is provided to enclose the chip region CR.

The lead lines 150 may be formed on the edge region ER of the film substrate 100. For example, the lead lines 150 may be formed on the top surface 100a of the film substrate 100. The lead lines 150 may include the input and output lines 151 and 152. The input lines 151 may be extended in an opposite direction of the output lines 152.

The protection layer 310 may be formed on the top surface 100a of the film substrate 100. The protection layer 310 may be formed on the lead lines 150. The protection layer 310 may be formed to cover at least a portion of the input and output lines 151 and 152. In some example embodiments, the protection layer 310 may be formed, e.g., by a screen printing process and/or a spray coating process. The protection layer 310 may be formed of (and/or include) an insulating material (e.g., solder resist materials).

Figure 15:
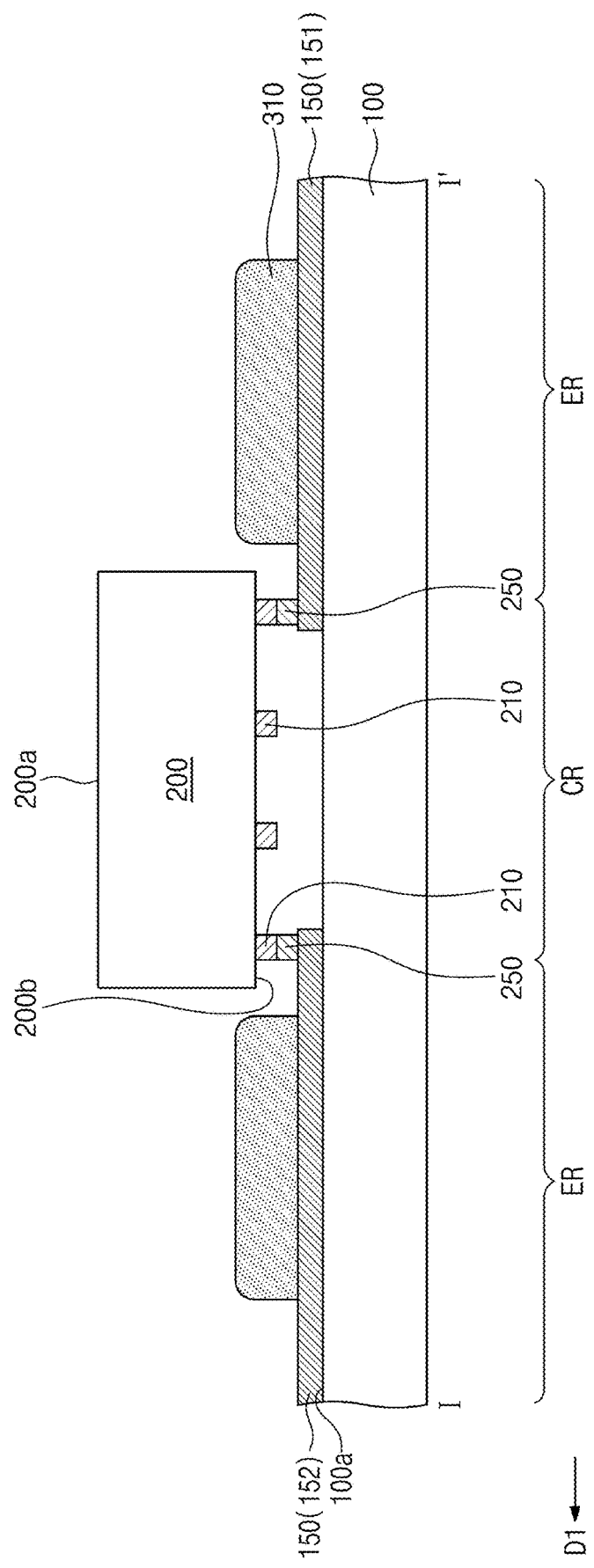

Referring to FIG. 15, the semiconductor chip 200 may be mounted on the top surface 100a of the film substrate 100. The semiconductor chip 200 may be disposed on the chip region CR of the film substrate 100. The mounting of the semiconductor chip 200 may, for example, may include heating the connection terminals 250 to a low flow state but without melting the connection terminals 250. The mounting of the semiconductor chip 200 may include electrically connecting the connection terminals 250 to corresponding ones of the input and output lines 151 and 152.

Referring back to FIG. 2, the under-fill layer 320 may be formed on the top surface 100a of the film substrate 100. The under-fill layer 320 may be formed to fill a gap region between the film substrate 100 and the semiconductor chip 200. The under-fill layer 320 may be formed to cover a portion of a side surface of the semiconductor chip 200 and to cover a portion of the protection layer 310. The under-fill layer 320 may be formed to hermetically seal and/or encapsulate the redistribution patterns 210 and the connection terminals 250. For example, the under-fill layer 320 may be formed by a capillary under-fill process. The under-fill layer 320 may be formed of (and/or) include at least one of insulating polymers (e.g., epoxy-based polymers). According to some example embodiments, the capillary under-fill process is not impeded by the presence of dense and/or compound structures, the capillary under-fill process may more completely fill the space between the semiconductor chip 200 and the film substrate 100, thereby preventing (and/or mitigating the potential for) voids forming.

According to some example embodiments of the inventive concept, the redistribution pattern 210 and the connection terminal 250 may be formed at the same step. Thus, since the redistribution pattern 210 is formed, it may be possible to increase a degree of freedom in designing an interconnection structure and to reduce fabrication cost.

Figure 16:
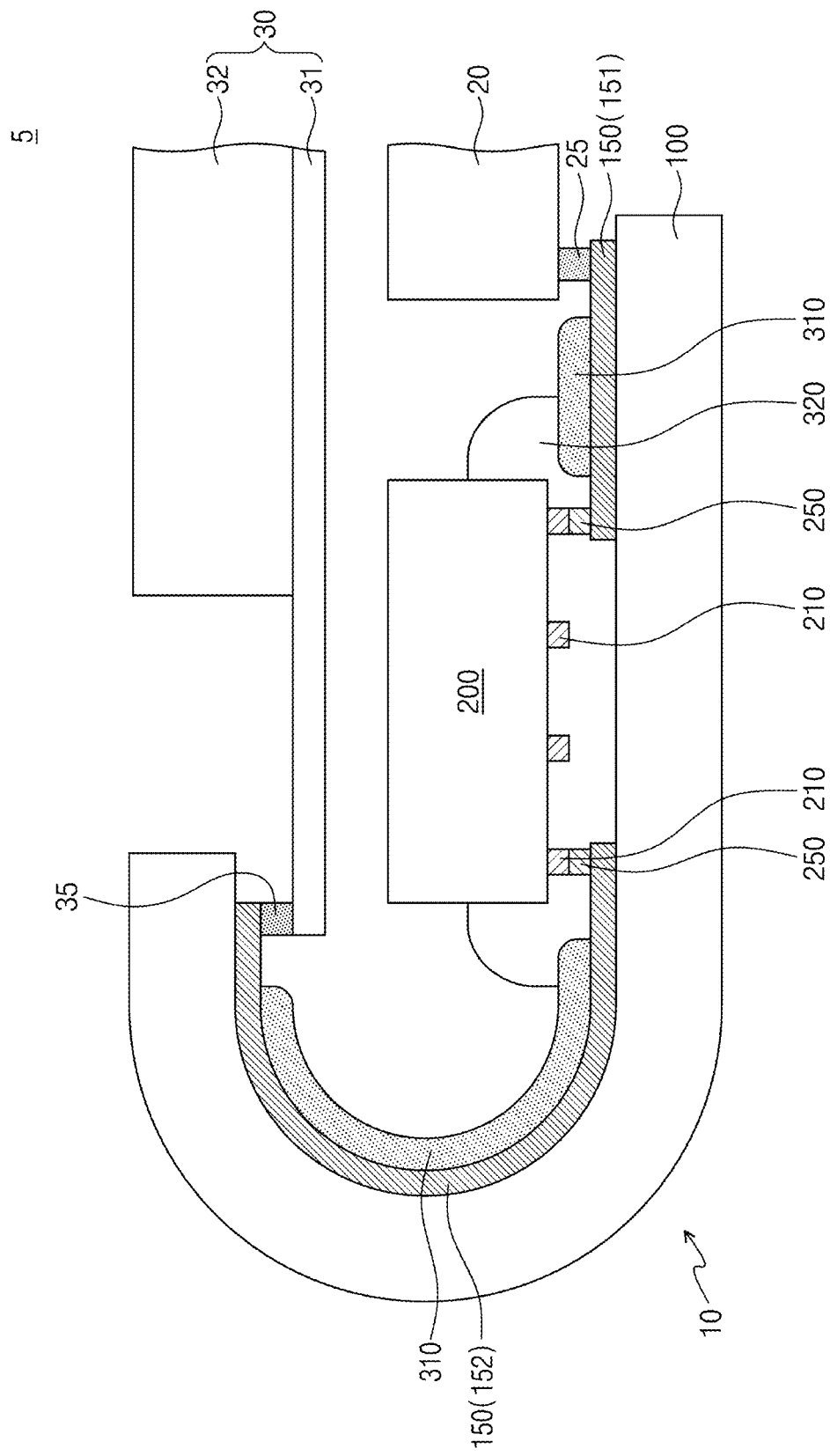
FIG. 16 is a sectional view illustrating a package module according to some example embodiments.

FIG. 16 is a sectional view illustrating a package module according to some example embodiments. For the sake of brevity, a previously described element may be identified by the same reference number without repeating an overlapping description thereof.

Referring to FIG. 16, a package module 5 may include a chip-on-film package 10, a circuit substrate 20, and a display device 30. In some example embodiments, the package module 5 may be a display device assembly. The chip-on-film package 10 may include the film substrate 100, the semiconductor chip 200, the redistribution pattern 210, the lead line 150, the connection terminal 250, the protection layer 310, and the under-fill layer 320. The chip-on-film package 10 may be substantially the same as the chip-on-film package 1 described with reference to FIGS. 1 to 5. However, the example embodiments are not limited thereto. For example, the chip-on-film package 10 may be substantially the same as the chip-on-film package 2 described with reference to FIGS. 6 and 7, and/or the chip-on-film package 3 described with reference to FIGS. 8 and 9.

The film substrate 100 may have a flexible property and may be bent. For example, in some example embodiments, the film substrate 100 may be bent such that a portion of the first surface 100a faces another portion of the first surface 100a.

The circuit substrate 20 may be disposed on the first surface 100a of the film substrate 100. The circuit substrate 20 may be placed near an edge portion of the film substrate 100. The circuit substrate 20 may be, for example, a printed circuit board (PCB) and/or a flexible printed circuit board (FPCB). An input connection portion 25 may be interposed between the input lines 151 and the circuit substrate 20 to electrically connect the input lines 151 to the circuit substrate 20. The circuit substrate 20 may be electrically connected to the semiconductor chip 200 through the input lines 151. In some example embodiment, the input connection portion 25 may include, e.g., an anisotropic conductive film (ACF).

The display device 30 may be disposed on the first surface 100a of the film substrate 100. The display device 30 may be placed near an opposite edge portion of the film substrate 100. The display device 30 may include a display substrate 31 and a display panel 32 which are stacked. An output connection portion 35 may be interposed between the output lines 152 and the display substrate 31 to electrically connect the output lines 152 to the display substrate 31. The display substrate 31 may be electrically connected to the semiconductor chip 200 through the output lines 152. In some example embodiments, the output connection portion 35 may include an adhesive layer including, e.g., an anisotropic conductive film (ACF), an instant adhesive, a thermo-curable adhesive, a laser-curable adhesive, a supersonic wave-curable adhesive, and/or the like.

The semiconductor chip 200 may receive signals from the circuit substrate 20 through the input lines 151. The semiconductor chip 200 may include driving integrated circuits (e.g., a gate driving integrated circuit and/or a data driving integrated circuit), which are configured to generate driving signals (e.g., a gate driving signal and/or a data driving signal). The driving signals, which are generated by the semiconductor chip 200, may be transmitted to gate lines and/or data lines of the display substrate 31 through the output lines 152. Accordingly, the display panel 32 can be driven.

According to some example embodiment, a chip-on-film package may include a redistribution pattern provided on a bottom surface of a semiconductor chip. Since the redistribution pattern is provided in the chip-on-film package, lead lines may not be extended to a space on a center region of the chip region. Thus, it may be possible to improve electric characteristics of transistors, which are provided adjacent to chip pads on the center region of the chip region in the semiconductor chip. In addition, it may be possible to prevent a void from being formed between the lead line and an under-fill layer and to improve the reliability of the chip-on-film package. Furthermore, since the redistribution pattern is provided, connection terminals may be arranged in a zigzag shape and may be provided to have a reduced pitch. Thus, it may be possible to reduce a size of the semiconductor chip and/or the chip-on-film package and to increases an integration density of the chip-on-film package.

According to some example embodiments, since lead lines are spaced apart from redistribution patterns, it may be possible to increase a degree of freedom in designing lead lines, redistribution patterns, connection terminals, and/or chip pads. In addition, since the redistribution pattern and the connection terminal are formed in the same step, it may be possible to reduce fabrication cost.

In the above description, spatially relative terms, such as "beneath," "lower," "bottom," "top," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While some example embodiments of the inventive concepts have been particularly shown and described, it will be understood by one of ordinary skill in the art that variations in form and detail may be made therein without departing from the spirit and scope of the attached claims.

What is claimed is:

1. A chip-on-film package, comprising:
   a film substrate including a chip region and an edge region;
   a semiconductor chip on a top surface of the chip region of the film substrate, the semiconductor chip comprising a chip pad;
   lead lines, including an input line and an output line, on a top surface of the edge region of the film substrate;
   a plurality of connection terminals between the film substrate and the chip pad; and
   a plurality of redistribution patterns between the semiconductor chip and the plurality of connection terminals,
   wherein the plurality of redistribution patterns comprise a first redistribution pattern and a second redistribution pattern,
   the plurality of connection terminals comprise a first connection terminal between the film substrate and the first redistribution pattern and a second connection terminal between the film substrate and the second redistribution pattern,
   the first redistribution pattern vertically overlaps with the first connection terminal, and
   only a portion of the second redistribution pattern vertically overlaps with the second connection terminal such that a proportion of the second redistribution pattern overlapping the second connection terminal is less than a proportion of the first redistribution pattern overlapping the first connection terminal.

2. The chip-on-film package of claim 1, wherein
   a width of the first redistribution pattern is equal to a width of the first connection terminal, and
   a width of the second redistribution pattern is larger than a width of the second connection terminal.

3. The chip-on-film package of claim 1, wherein
   the plurality of redistribution patterns are vertically spaced apart from at least one of the input line or the output line, and
   a top surface of a corresponding one of the plurality of redistribution patterns is coplanar with a bottom surface of the chip pad.

4. The chip-on-film package of claim 1, wherein the input line and the output line are not extended to a space corresponding to a center region of the chip region.

5. The chip-on-film package of claim 1, further comprising:
   an additional input line in a center region of the chip region,
   wherein the additional input line crosses at least one of the plurality of redistribution patterns, when viewed in a plan view.

6. The chip-on-film package of claim 1, wherein the plurality of connection terminals are in a zigzag shape.

7. The chip-on-film package of claim 1, wherein a height of the plurality of redistribution patterns is 20% to 80% of a combined height of the height of the plurality of redistribution patterns and a height of the plurality of connection terminals.

8. The chip-on-film package of claim 1, wherein the plurality of redistribution patterns comprises a same material as at least one the input line or the output line.

9. The chip-on-film package of claim 1, wherein the plurality of redistribution patterns comprises copper.

10. The chip-on-film package of claim 1, wherein
an area of the first redistribution pattern is equal to an area of the first connection terminal, when viewed in a plan view, and
an area of the second redistribution pattern is larger than an area of the second connection terminal, when viewed in the plan view.

11. A chip-on-film package, comprising:
a film substrate;
a semiconductor chip on a top surface of the film substrate, the semiconductor chip comprising chip pads;
lead lines on the top surface of the film substrate and electrically connected to the semiconductor chip;
redistribution patterns between the chip pads of the semiconductor chip and the film substrate, the redistribution patterns comprising a first redistribution pattern and a second redistribution pattern;
a first connection terminal between one of the lead lines and the first redistribution pattern; and
a second connection terminal between another of the lead lines and the second redistribution pattern,
wherein side surfaces of the first redistribution pattern are coplanar with corresponding side surfaces of the first connection terminal.

12. The chip-on-film package of claim 11, wherein only a portion of the second redistribution pattern is vertically overlapped with the second connection terminal.

13. The chip-on-film package of claim 11, wherein the film substrate is a flexible substrate comprising polyimide.

14. The chip-on-film package of claim 11, further comprises:
a passivation layer on a bottom surface of the semiconductor chip, the passivation layer exposing the chip pads.

15. The chip-on-film package of claim 11, wherein
the lead lines comprise an output line and an input line,
an end of the output line is connected to the semiconductor chip,
an opposite end of the output line is extended in a first direction,
an end of the input line is connected to the semiconductor chip, and
an opposite end of the input line is extended in a direction opposite to the first direction.

16. The chip-on-film package of claim 11, wherein the second connection terminal exposes a portion of the second redistribution pattern.

17. A chip-on-film package, comprising:
a film substrate;
a semiconductor chip on a top surface of the film substrate, the semiconductor chip comprising a chip pad;
lead lines, including an input line and an output line, on the top surface of the film substrate and electrically connected to the semiconductor chip, the input line extending in an opposite direction to the output line;
a connection terminal between the film substrate and the semiconductor chip;
a redistribution pattern between a bottom surface of the chip pad and the connection terminal;
a protection layer covering at least a portion of at least one of the input line or the output line; and
an under-fill layer on the top surface of the film substrate, the under-fill layer filling a gap region between the film substrate and the semiconductor chip and encapsulating the redistribution pattern.

18. The chip-on-film package of claim 17, wherein
the redistribution pattern comprises a seed pattern and a conductive pattern, and
the seed pattern is between the bottom surface of the chip pad and the conductive pattern.

19. The chip-on-film package of claim 17, wherein
the connection terminal is included in a plurality of connection terminals, and
the plurality of connection terminals in an in-line shape such that the plurality of connection terminals are aligned to each other in a direction parallel to the top surface of the film substrate, when viewed in a plan view.

* * * * *